United States Patent [19]

Platt et al.

[11] 3,778,640

[45] Dec. 11, 1973

[54] SIGNAL VOLTAGE LEVEL TRANSLATING CIRCUIT

[75] Inventors: Steven Platt, Underhill, Vt.; Jehoshua N. Pomeranz, Suffern, N.Y.; Dinesh K. Tewarson, Essex Junction, Vt.

[73] Assignee: International Business Machines Corporation, Armonk, N.Y.

[22] Filed: July 3, 1972

[21] Appl. No.: 268,315

[52] U.S. Cl. .................. 307/254, 307/296, 307/297

[51] Int. Cl. .................. H03k 17/00

[58] Field of Search .................. 307/296, 297, 254; 328/183; 323/4

[56] References Cited

UNITED STATES PATENTS

| | | | |
|---|---|---|---|
| 3,651,347 | 3/1972 | Limberg | 323/4 |
| 3,517,224 | 6/1970 | Murphy | 307/297 |
| 3,651,346 | 3/1972 | Limberg | 307/296 |

*Primary Examiner*—John S. Heyman
*Assistant Examiner*—B. P. Davis
*Attorney*—Martin G. Reiffin et al.

[57] ABSTRACT

A signal voltage level translating circuit receives an input electrical signal having predetermined voltage swings about a first predetermined voltage level and translates the voltage level of the signal so that at the output there is provided an output electrical signal having the same voltage swings about a second predetermined voltage level translated with respect to the first voltage level. An input transistor has its base connected to the input node and its emitter connected to one end of a first impedance element having its other end connected to the collector of a current source transistor. A fixed reference voltage is applied to the base of a reference voltage transistor having its emitter connected to one end of a second impedance element having an impedance equal to that of the first impedance element. The other end of the second impedance element is connected to the collector of a diode-connected transistor having its base connected to the base of the current source transistor. The emitter of the diode-connected transistor is connected to the emitter of the current source transistor. If implemented in the form of a monolithic integrated circuit, the diode-connected transistor and current source transistor may have the same base and the same emitter. The translated signal is taken at the output where the first impedance element is connected to the collector of the current source transistor.

9 Claims, 1 Drawing Figure

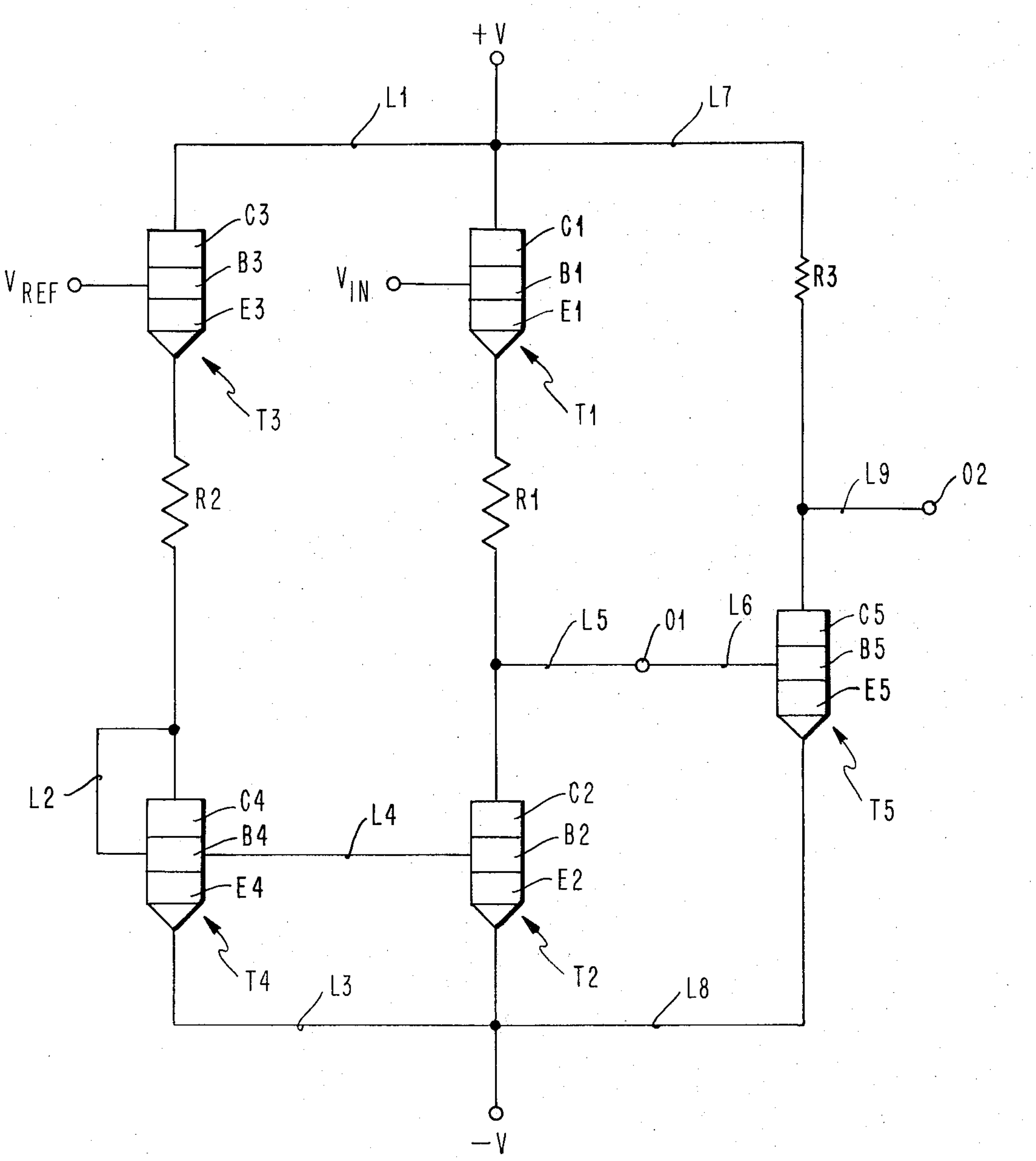
+V
L1
L7
C3
B3
E3
VREF
T3
C1
B1
E1
VIN
T1
R3
R2
R1
L9
02
L5
01
L6
C5
B5
E5
T5
L2
C4
B4
E4
T4
L4
C2
B2
E2
T2
L3
L8
-V

SIGNAL VOLTAGE LEVEL TRANSLATING CIRCUIT

BACKGROUND OF THE INVENTION

1. Field of the Invention

This invention relates to a signal voltage level translating circuit which receives an input electrical signal having a predetermined voltage swings about a first predetermined voltage level and which translates said signal so as to provide at the output a signal with said predetermined voltage swings about a second predetermined voltage level translated wigh respect to the first predetermined level. The present circuit may be utilized in digital computers as an interface between two different types of logic circuitry operating at different respective voltage levels, or may be utilized to activate a power gate driver circuit in bipolar transistor memories, or wherever a signal is to be translated from one voltage to another level.

2. Description of the Prior Art

It is frequently necessary to translate an electrical signal from one voltagle level to a different voltage level; that is, to produce an output signal having a waveform identical to that of the input signal but differing therefrom by a precisely predetermined and unvarying voltage difference. For example, it may be necessary to interconnect one type of logic circuitry, such as emitter-coupled-logic (ECL), having voltage swings about one voltage level, to a different type of logic circuitry, such as transistor-transistor-logic (TTL), having voltage swings about a different voltage level.

Another example is the provision of a driving input signal to a power gate driver circuit which power up only selected chips during a given memory cycle of a bipolar transistor memory utilized in digital computers. The power gate driver circuit requires a driving input signal having a voltage level that is near the voltage of the most negative power supply, whereas the logic circuitry may provide a signal at a voltage level much higher than that required for the input signal to the power gate driver circuit.

In the prior art, signal voltage level translation was usually performed by a series arrangement of diodes. However, this translation arrangement is highly disadvantageous because the voltage level of the resulting output signal is not precisely predetermined and fixed, but instead may vary considerably from circuit to circuit, and even from time to time with the same circuit, due to variations in the base-emitter voltages of the diodes, changes in temperature, and power supply tolerances.

SUMMARY OF THE INVENTION

It is therefore a primary object of the present invention to provide a novel signal voltage level translating circuit which obviates the above-noted disadvantages of the prior art translating circuit. That is, the present invention provides signal voltage level translation which is preceisely predetermined and unvarying notwithstanding variations in diode voltages, temperature and power supply tolerances.

This object is achieved by a novel circuit comprising an input node for receiving the electrical signal to be translated. An input transistor has a base connected to the input node. A first impedence element has one end connected to the emitter of the input transistor and another end connected to the collector of a current source transistor. A reference voltage node for receiving a reference voltage signal is connected to the base of a reference voltage transistor having an emitter connected to a second impedance having an impedance substantially equal to the impedance of the first impedance element. A diode-connected transistor has a collector connected to the other end of the second impedance element. The diode-connected transistor and the current source transistor have a common base and a common emitter when the circuit is implemented in the form of a monolithic integrated circuit.

Other objects and advantages of the present invention are inherent in the circuitry disclosed and/or will be apparent to those skilled in the art as the detailed description proceeds below.

BRIEF DESCRIPTION OF THE DRAWING

The FIGURE is a circuit diagram showing schematically a preferred embodiment of a signal voltage level translating circuit in accordance with the present invention, together with a power gate driver transistor driven by the output signal from the translating circuit.

DESCRIPTION OF THE PREFERRED EMBODIMENT

Circuit

Referring now the FIGURE in more detail, the reference designation $V_{IN}$ designates an input node for receiving the electrical signal having voltage swing about an upper voltage level and to be translated to a lower voltage level by the circuit of the present invention. Input node $V_{IN}$ is connected to the base of B1 of a first input transistor T1 having a collector C1 connected to a positive voltage source +V. Input transistor T1 further comprises an emitter E1 connected to the upper end of a first impedance element in the form of a resistor R1 having its lower end connected to the collector C2 of a second current source transistor T2. The latter has an emitter E2 connected to a negative voltage source −V.

A voltage reference node $V_{REF}$ is provided for receiving a reference voltage signal and is connected to the base B3 of a third reference voltage transisitor T3. The latter has a collector C3 connected by a lead L1 to positive voltage source +V. Transistor T3 also has an emitter E3 connected to the upper end of a second impedance element in the form of a resistor R2 having a resistance substantially equal to the resistance of resistor R1.

The lower end of resistor R2 is connected to the collector of a fourth diode-connected transistor T4. Collector C4 is shorted by a lead L2 to the base B4 of transistor T4. The latter further comprises an emitter E4 connected by a lead L3 to negative voltage source −V. Base B4 of transistor T4 is connected by a lead L4 to base B2 of transistor T2. If the circuit is implemented in the form of a monolithic integrated circuit, as is preferred, base B2 of transistor T2 is the same base region as base B4 of transistor T4, and emitter E2 of transistor T2 is the same emitter region as emitter E4 of transistor T4.

The output of the signal voltage level translating circuit is indicated at node O1 connected by a lead L5 to collector C2 of transistor T2 and the lower end of resistor R1. Output node O1 is connected by a lead L6 to the base B5 of a fifth power gate driver transistor T5 which is included to show how the signal voltage level translating circuit of the present invention may be utilized as a translated signal for activating a power gate driver. Transistor T5 further comprises a collector C5 connected to the lower end of a load resistor R3 having its upper end connected by a lead L7 to positive voltage source +V. Transistor T5 also has an emitter E5 connected by a lead L8 to negative voltage source −V. The output of transistor T5 is designated by an output node O2 connected by a lead L9 to collector C5 and the lower end of load resistor R3.

Operation

In a preferred embodiment of the invention, positive voltage source +V is at ground level, negative voltage source −V is at −4.0 volts, and reference voltage node $V_{REF}$ is maintained at −1.25 volts. Resistors R1 and R2 are each 1.25 K ohms. The current in transistors T3 and T4 is determined by resistor R2, as follows. The voltage at the upper end of resistor R2 is equal to the voltage at reference voltage node $V_{REF}$ minus the voltage drop across the base-emitter junction of transistor T3, or about −2.0 volts. The voltage at the lower end of resistor R2 is equal to the voltage of negative voltage source −V plus the voltage drop across the base emitter junction of transistor T4, or about −3.25 volts. Therefore the voltage drop across resistor R2 equals 3.25 minus 2.0 volts, or 1.25 volts. Therefore the current through resistor R2, and hence also the current through transistors T3 and T4, equals 1.25 volts divided by 1.25 K ohms which is equal to 1.0 milliamperes.

Since transistors T2 and T4 have a common base and a common emitter, the current in transistor T2 is equal to the current in transistor T4. Assuming for the moment that the voltage at input node $V_{In}$ is equal to the voltage at reference voltage node $V_{REF}$, then the voltage at emitter E1 of transistor T1 is equal to the voltage at emitter E3 of transistor T3. Since the resistance of resistor R1 is equal to the resistance of resistor R2 and the current through resistor R1 is equal to the current through resistor R2, it will be seen that the voltage at collector C2 of transistor T2 is equal to the voltage at collector C4 and base B4 of transistor T4.

Now let it be assumed that there is applied to input node $V_{In}$ an input electrical signal having predetermined voltage swings about a first predetermined voltage level which may be regarded as the reference voltage at reference voltage node $V_{REF}$. For example, let it be assumed that the voltage at input node $V_{IN}$ swings upwardly by a predermined voltage increment. The voltage at emitter E1 of transistor T1 swings upwardly by substantially the same voltage increment since transistor T1 operates in the emitter-follower mode. However, the current in transistor T2 remains the same as the current in transistor T4 due to the common base and emitter of these transistors. Therefore, assuming a negligible loading effect by transistor T5, the current through resistor R1 and hence the voltage drop across the resistor R1 remains the same, and the voltage at the lower end of resistor R1 and at the output node O1 swings upwardly by substantially the same voltage increment as the input signal at input node $V_{In}$. Therefore there appears at output node O1 of the signal level translating circuit an output signal having the same voltage swings as the input signal at input node $V_{IN}$, but translated downwardly in voltage to a second voltage level 2.0 volts below the first voltage level at input node $V_{IN}$.

More specifically, if the signal at input node $V_{IN}$ swings upwardly from the first reference voltage level of −1.25 volts to −.75 volt, then the voltage of the translated signal at output node O1 swings upwardly from the second voltage level of −3.25 volts to −2.75 volts. Similarly, if the input signal at input node $V_{IN}$ swings downwardly to −1.75 volts, then the translated signal at output node O1 swings downwardly to to −3.75 volts.

Modified Embodiment

It should be understood that input node $V_{IN}$ and reference voltage node $V_{REF}$ may be interchanged. That is, the input signal may be applied to base B3 of transistor T3, and the reference voltage signal may be applied to base B1 of transistor T1. A voltage replica of the input signal applied to base B3 of transistor T3 appears at output node O1 reversed in phase. That is, when the input signal at base B3 is up, the output signal at node O1 is down, and vice versa. The increments or decrements of current in transistors T3, T4 and resistor R2 caused by the voltage swings of the input signal at base B3 of transistor T3 cause correspondingly equal increments or decrements of current in transistors T1, T2 and resistor R1 and therefore cause the voltage at output node O1 to vary with swings of thhe same magnitude but opposite direction as the voltage of the input signal applied to base B3 at transistor T3.

Application to Power Gate Driver

The signal voltage level translating circuit in accordance with the preferred embodiment of the invention comprises a transistors T1, T2, T3, T3 and is shown in the drawing as connected to a power gate driver transistor T5. The latter required an input signal having a voltage level near that of negative voltage source −V to which the emitter E5 of transistor T5 is connected. Transistor T5 further comprises a base B5 connected by a lead L6 to output O1 of the signal voltage level translating circuit, and a collector C5 connected to the lower end of a load resistor R3 having its upper end connected by a lead L7 to positive voltage source +V. Output node O2 is connected by a lead L9 to collector C5.

The signal voltage level translating circuit translates the input signal from a voltage level of −1.125 volts to a lower voltage level of −3.25 volts and the translated output signal O1 is applied to base B5 of transistor T5. When the signal to base B5 is "up" at −2.75 volts, transistor T5 goes into saturation and the voltage at output O2 swings downwardly and approaches that of negative voltage source −V. When the translated output signal at output node O1 swings downwardly to −3.75 volts, then transistor T5 is cut off and the voltage at output node O2 swings upwardly to approach the voltage of positive voltage source +V. The output voltage of power gate driver transitor T5 thus swings across the full voltage drop of the power supply.

It is to be understood that specific embodiments of the invention disclosed herein are merely illustrative of two of the many forms which the invention may take in practice and that numerous modifications thereof will readily occur to those skilled in the art without departing from the scope of the invention delineated in the appended claims which are to be construed as broadly as permitted by the prior art.

We claim:

1. A signal voltage level translating circuit comprising input means for receiving an electrical signal having predetermined voltage swings about a first predetermined voltage level,
impedance means having a predetermined impedance and having one end connected to said input means,
a substantially constant current source connected to the other end of said impedance means for supplying a relatively constant current therethrough,
an output node connected to said other end of said impedance means for transmitting said signal with said predetermined voltage swings about a second predetermined voltage level translated with respect to said first predetermined level,
said impedance means comprising a resistor having a predetermined resistance,
said current source comprising a transistor having a collector connected to said output node and to said other end of said impedance means,
said input means comprising an input node for receiving said electrical signal, an input transitor having a base connected to said input node and having an emitter connected to said one end of said impedance means, and
reference voltage means independent of said input means, and for controlling the magnitude of said constant current in response to a reference voltage independent of said electrical signal.

2. A signal voltage level translating circuits as recited in claim 1 wherein
said reference means comprises
a reference voltage node for receiving a reference voltage at said first predetermined voltage level,
a reference voltage transistor having a base connected to said reference voltage node and having an emitter, and
circuit means connecting said reference voltage transitor emitter to said current source.

3. A signal voltage translating circuit as recited in claim 2 wherein
said circuit means comprises
a pair of impedances connected in series at a common node, and
means connecting said common node to said current source for determining the magnitude of the current of said current source in response to the voltage of said common node.

4. A signal voltage level translating circuit as recited in claim 3 wherein
on of said pair of impedances is a resistance and the other of said pair of impedances as a diode.

5. A signal level translating circuit as recited in claim 4 wherein
said resistance has an impedance substantially equal to said predetermined impedance of said first-recited impedance means.

6. A circuit as receited in claim 5 wherein
said current source transistor has an emitter,
a voltage source connected to said last-recited emitter,
a driver transistor having a collector, a base, and an emitter,
a first conductor connectedd between said output node and said driver transistor base,
a second conductor connected between said voltage source and said driver transistor emitter, and
a driver output connected to said driver transistor collector.

7. A circuit as recited in claim 1 wherein
said current source transistor has an emitter,
a voltage source connected to said last-recited emitter,
a driver transitor having a collector, base, and an emitter,
a first conductor connected between said output node and said drive transistor base,
a second conductor connected between said voltage source and said driver transistor emitter, and
a driver output connected to said driver transistor collector.

8. A circuit as recited in claim 9 and comprising
a fifth transistor having a collector, a base, and an emitter,
a first conductor connected between said output node and said fifth transistor base,
a second conductor connected between said emitters of said fourth and
second transistors and said fifth transistor emitter, and
an output connected to said fifth transistor collector.

9. A signal voltage level translating circuit comprising
an input node for receiving an electrical signal having predetermined voltage swings about a first predetermined voltage level,
a first transistor having a base and an emitter,
a first impedance element having one end connected to said emitter,
a second transistor having a base and an emitter and having a collector connected to the other end of said first impedance element,
a reference voltage node independent of said input node for receiving independently of said input signal a reference voltage at said first predetermined voltage level,
a third transistor haivng a base and an emitter,
a second impedance element having one end connected to said third transistor emitter and having an impedance substantially equal to the impedance of said first impedance element,
a fourth transistor having a collector connected to the other end of said second impedance element and having a base and an emitter,
first means shorting said base and collector of said fourth transistor,
second means connecting said fourth transistor base to said second transistor base,
third means connecting said fourth transistor emitter to said second transistor emitter,
an output node for transmitting said signal with said predetermined voltage swings about a second predetermined voltage level translated with respect to said first predetermined voltage level,
fourth means connecting said output node to said second transistor collector,
fifth means connecting said first transistor base to one of said nodes, and
sixth means connecting said third transistor base to the other of said nodes.

* * * * *